United States Patent
Yamada et al.

(10) Patent No.: US 6,313,032 B1
(45) Date of Patent: Nov. 6, 2001

(54) METHOD FOR MANUFACTURING A SALICIDE TRANSISTOR, SEMICONDUCTOR STORAGE, AND SEMICONDUCTOR DEVICE

(75) Inventors: Keiichi Yamada; Atsushi Hachisuka, both of Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/755,178

(22) Filed: Jan. 8, 2001

(30) Foreign Application Priority Data

Jul. 21, 2000 (JP) ................................. 12-220606

(51) Int. Cl.[7] .......................... H01L 21/283; H01L 21/28
(52) U.S. Cl. ..................... 438/649; 438/299; 438/303; 438/583; 438/592; 438/682; 438/685
(58) Field of Search ..................... 438/299, 303, 438/649, 592, 682, 685, 583

(56) References Cited

U.S. PATENT DOCUMENTS

| | | | |
|---|---|---|---|
| 5,563,100 | * 10/1996 | Matsubara | 438/303 |
| 6,001,737 | * 12/1999 | Horiuchi et al. | 438/683 |
| 6,198,143 | * 3/2001 | Ohsaki | 257/412 |

FOREIGN PATENT DOCUMENTS

| | | |
|---|---|---|
| 62-143473 | 6/1987 | (JP) . |
| 64-760 | 1/1989 | (JP) . |
| 11-312804 | 11/1999 | (JP) . |

* cited by examiner

*Primary Examiner*—Vu A. Le
*Assistant Examiner*—Beth E. Owens
(74) *Attorney, Agent, or Firm*—McDermott, Will & Emery

(57) ABSTRACT

A method for manufacturing a salicide transistor, a semiconductor storage, and a semiconductor device that can solve both an increase in narrow-line resistance and an increase in P-N-junction leakage, and can give an optimized process as the total LSI device manufacturing process flow.

After adding an impurity in the high-concentration source/drain region on a semiconductor substrate, a heat treatment is performed at a first temperature, then a heat treatment is performed for forming salicide at a second temperature higher than a predetermined temperature and lower than the first temperature for a first period of time, an interlayer insulating film is formed, and heat treatment is performed at a third temperature higher than the second temperature and lower than the first temperature. Since the crystallinity of the implanted layer 109 has been recovered before forming the silicide protecting film, salicide can be formed under the conditions where the crystallinity of the diffusion layer is good. Since heat treatment is also optimized during and after the salicide process, both an increase in narrow-line resistance and an increase in junction leakage can be inhibited.

12 Claims, 3 Drawing Sheets

METHOD FOR MANUFACTURING A SALICIDE TRANSISTOR, SEMICONDUCTOR STORAGE, AND SEMICONDUCTOR DEVICE

BACKGROUND OF THE INVENTION

1. Field of the Invention

The present invention relates to a method for manufacturing a salicide transistor, a semiconductor storage, and a semiconductor device, and more specifically to a method for manufacturing a salicide transistor that uses cobalt silicide as the salicide, a semiconductor storage such as a DRAM that uses the above salicide transistor, and a semiconductor device formed by packaging the above semiconductor storage and a logic device.

2. Description of Related Art

In order to increase the operating speed of an LSI, it is essential to decrease the parasitic resistance of transistors that is an element configuring the LSI. For this reason, a silicide has been used for decreasing the resistance of the diffusion region of a transistor. When a silicide is used, there are the following two technical problems:

(1) Increase in the sheet resistance of the silicide formed on the diffusion region of a width of about 0.3 μm or less (known as increase in narrow-line resistance), and (2) Occurrence of P-N-junction leakage in the silicide formed on a shallow P-N junction in the source/drain region.

Although the formation of a thick silicide layer is considered as the solution for the above problem (1), this is not the best method because this may cause the junction leakage of a shallow P-N junction. If the heat-treatment step is unavoidable for the formation of a film between contact layers or the formation of a capacitor structure, the silicide is easily degraded by the heat treatment, for example, the resistance of the silicide is easily increased by aggregation. The lowering of the heat-treatment temperature is considered to solve this problem. Although the resistance of the silicide is lowered by merely lowering the heat-treatment temperature, the desired element structure cannot be formed. For the above reason, the control of increase in the narrow-line resistance of the silicide becomes extremely difficult.

Although the formation of a thin silicide layer is considered for solving the above problem (2), this is not the best method because the sheet resistance is increased by decreasing the thickness of the silicide, and the effect of decreasing parasitic resistance cannot be obtained. The above-described problems (1) and (2) are in a trade-off relationship with each other.

Furthermore, with the reduction of the element size, the source/drain P-N junction becomes shallower. Since even the local protrusion of a silicide film may cause P-N-junction leakage to occur, the techniques for improving the uniformity of the film thickness, and for eliminating the irregularity of the silicide-silicon interface have been demanded. Since the morphology of silicide is affected not only by the process conditions of silicide formation, but also by the conditions of preceding and following processes, the optimization of the total process becomes essential.

FIGS. 3(A)–3(E) show the manufacturing flow of a conventional salicide transistor exemplified by the formation on an NMOS. In FIG. 3, reference numeral 100 denotes a P-type silicon (Si) substrate, 102 denotes a P well, 101 denotes an element separating oxide film formed on the P well 102, 103 denotes a gate oxide film, 104 denotes an N-type polysilicon (poly-Si) gait electrode formed on the gate oxide film 103, 105 denotes a WSi gate electrode formed on the N-type poly-Si gate electrode 104, 106 denotes an oxide film formed on the WSi gate electrode 105, 108 denotes a side wall that covers the side of the WSi gate electrode 105 and the like, 107 denotes an N-type LDD (lightly doped drain) region, and 116 denotes a high-concentration implanted layer (high-concentration diffusion layer) region.

As FIG. 3(A) shows, the formation of element separating oxide films 101, the implantation of P wells 102, the formation of gate electrodes 105 and the like, the formation of N$^-$-type LDD region 107, and the formation of side walls 108 are performed by known methods, and an impurity is implanted into the region 109 where the high-concentration diffusion layer of source/drain regions and the like is formed. An opening is made in only the implantation region by the patterning of a photoresist (not shown), 4×10 cm$^{-2}$ of As$^+$ ions are implanted under the condition of an energy of 30 keV, and 1×10 cm$^{-2}$ of P$^+$ ions are implanted under the condition of an energy of 40 keV.

Prior to salicide forming process, a protecting film is formed and patterned to protect regions from the silicying reaction where silicide is not to be formed. In FIG. 3(B), reference numeral 109 denotes a high-concentration source/drain region formed by the above-described impurity implantation. As FIG. 3(B) shows, a TEOS oxide film 115 of a thickness of 50 nm is formed as the protecting film from the silicfying reaction using the reduced pressure CVD method at a film formation temperature of 670° C. Thereafter, the resist is patterned using a photolithography process to open a desired portion for forming silicide. Next, the oxide film is removed from the opened portion of the resist using a diluted HF aqueous solution, and then the photoresist is removed using ashing by oxygen plasma.

As FIG. 3(C) shows, cobalt silicide (CoSi$_2$) 110 is formed only in the region where Si is exposed using a salicide flow. First, the oxide film is removed using a diluted HF aqueous solution from the Si surface of the region 109 where the high-concentration diffusion layer is to be formed. Next, lump annealing is performed in an N$_2$ atmosphere at 430° C. for 90 seconds to allow Co to react with Si to form a Co—Si compound, and then free Co is removed using a nitric acid/acetic acid/phosphoric acid mixed aqueous solution. Thereafter, lump annealing is performed in an N$_2$ atmosphere at 850° C. for 60 seconds.

As FIG. 3(D) shows, an interlayer insulating film is formed. A thin Si$_3$N$_4$ film 111 of a thickness of 10 nm is formed using the reduced pressure CVD method at a film forming temperature of 700° C., on which a BPSG (borophosphosilicate glass) film 112 of a thickness of 60 nm is formed using the normal pressure CVD method at a film forming temperature of 350° C. Thereafter, heat treatment is performed for the reflow of the BPSG film 112 in the purpose of improving the embedding property of the interlayer film between gate electrodes 105 or the like, and improving surface flatness. The reflow is performed in an H$_2$/O$_2$ atmosphere of an atmospheric pressure at 800° C. for 20 minutes. This heat treatment also recovers the crystallinity of the implanted layer 109 in the diffusion region, and activates the added impurity.

Thereafter, as FIG. 3(E) shows, a barrier metal (TiN) 116 and a contact plug (W plug) 113 structures are formed after opening the contact holes, and wiring (aluminum wiring) 114 is formed. When a device having a DRAM and a logic device is formed, the memory-cell capacitor structure is also formed.

In conventional methods for manufacturing a salicide transistor, as described above, the heat treatment for recovering the crystallinity of the source/drain implanted layer 109 and activating the added impurity was also used as the heat treatment for the reflow of the interlayer film. Since silicide 110 was formed on the surface of Si having poor crystallinity after source/drain implanting, the morphology of the silicide 110 was poor, and caused the narrow-line resistance to increase and junction leakage to occur. Since the silicide 110 was formed at a temperature as high as 850° C., the heat treatment in the total process was also excessive. Moreover, since the heat treatment for the reflow of the interlayer film or the like was added, the distribution of the source/drain impurity expanded due to diffusion, there were the problems of increase in off-leakage due to the short-channel effect of the transistor, and decrease in current driving capability due to increase in parasitic resistance.

As described above, since the problem of increase in narrow-line resistance and the problem of the occurrence of P-N-junction leakage are in the trade-off relationship in the technical solution, the simultaneous solution of the both problems is very difficult. Even if the both problems are considered separately, when the LSI manufacturing process is totally seen, it is the present situation that the solution is difficult from the limitation of the process conditions for obtaining desired element structures or element properties. In particular in the manufacture of an LSI device containing both a DRAM and a high-speed logic device, since various heat-treatment processes are used for producing a DRAM capacitor structure through the use of silicide, the solution of the above-described problems is extremely difficult.

SUMMARY OF THE INVENTION

Therefore, the object of the present invention is to solve the above-described problems, and to provide a method for manufacturing a salicide transistor that solves the problem of increase in narrow-line resistance and the problem of the occurrence of P-N-junction leakage simultaneously, and is able to offer the optimal process as the total LSI device manufacturing process flow; a semiconductor storage; and a semiconductor device.

According to a first aspect of the present invention, there is provided a method for manufacturing a salicide transistor, comprising the steps of: performing heat treatment at a first temperature after implanting an impurity into a high-concentration source/drain region on a semiconductor substrate; forming salicide by heat-treating a predetermined region on the semiconductor substrate at a second temperature higher than a predetermined temperature and lower than the first temperature for a first period of time; and performing heat treatment at a third temperature higher than the second temperature and lower than the first temperature after forming an interlayer insulating film on the semiconductor substrate that contains the salicide.

According to a second aspect of the present invention, there is provided a semiconductor storage, comprising salicide transistors manufactured using the method for manufacturing a salicide transistor according to the present invention.

According to a third aspect of the present invention, there is provided a semiconductor device, comprising a semiconductor storage and a logic device comprising salicide transistors manufactured using the method for manufacturing a salicide transistor according to the present invention.

The above and other objects, effects, features and advantages of the present invention will become more apparent from the following description of the embodiments thereof taken in conjunction with the accompanying drawings.

DETAILED DESCRIPTION OF THE PREFERRED EMBODIMENTS

Figure 1:
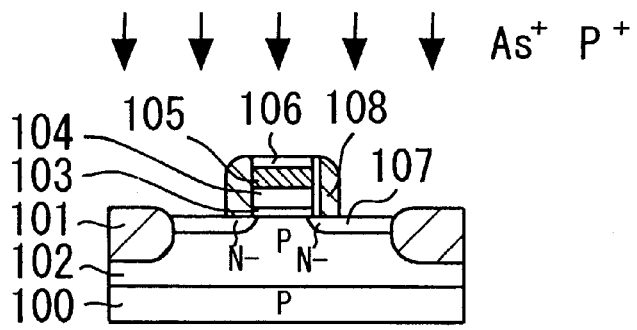
FIGS. 1(A)–(E) shows a process flow of manufacturing a salicide transistor according to first embodiment of the present invention
Figure 1:
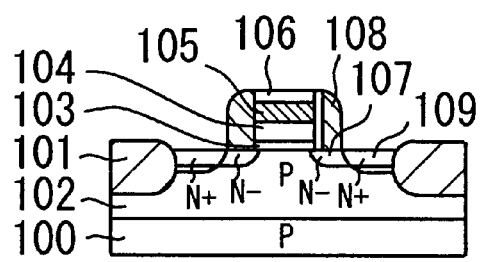
Figure 1:
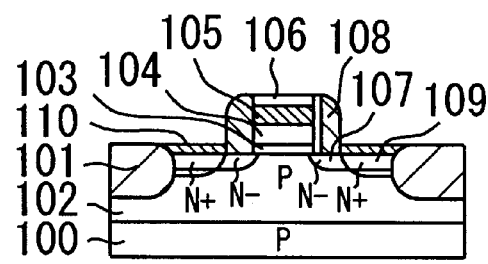
Figure 1:
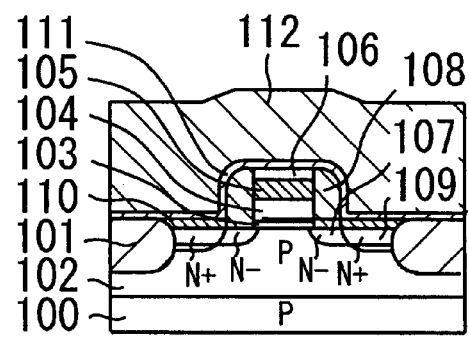
Figure 1:
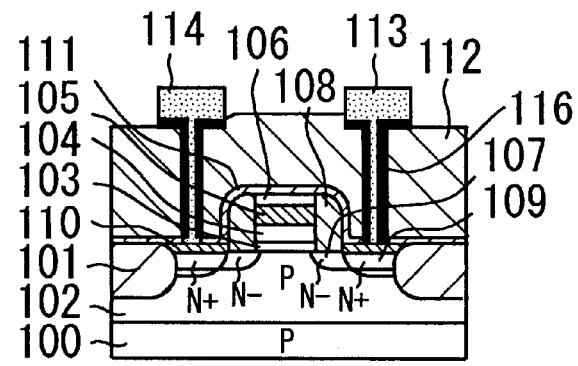
Figure 2:
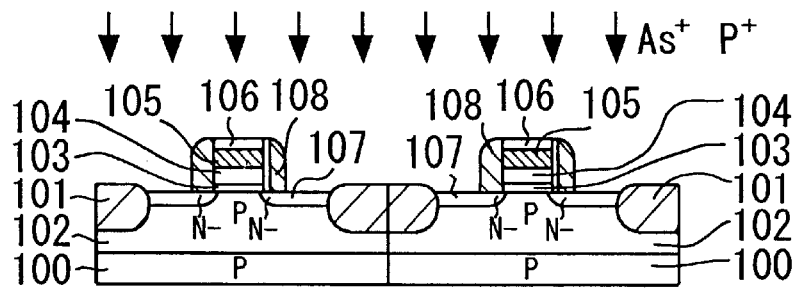
FIGS. 2(A)–2(F) shows the process flow of manufacturing a salicide a transistor according to second embodiment of the present invention
Figure 2:
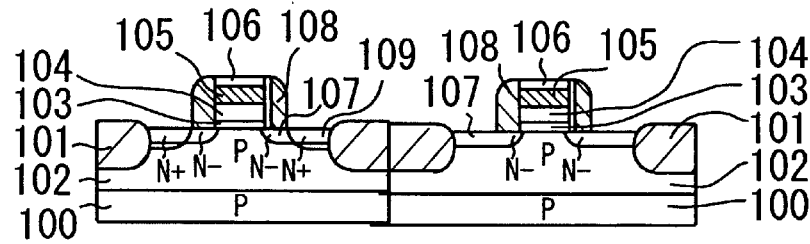
Figure 2:
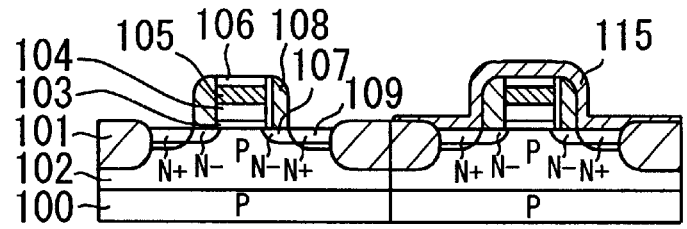
Figure 2:
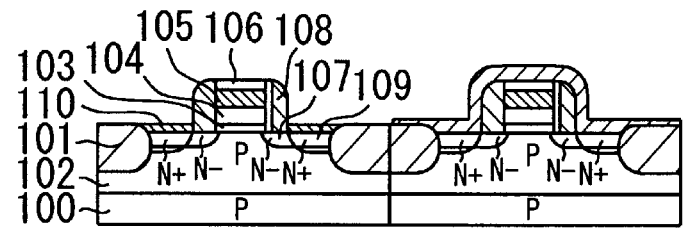
Figure 2:
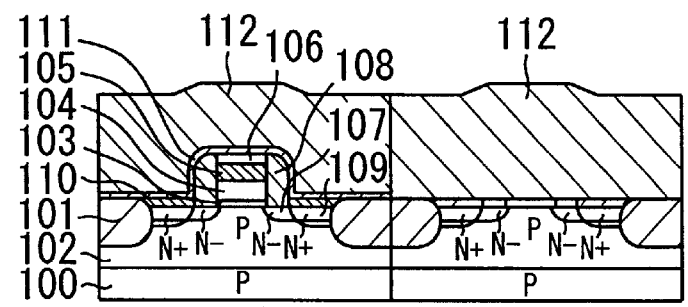
Figure 2:
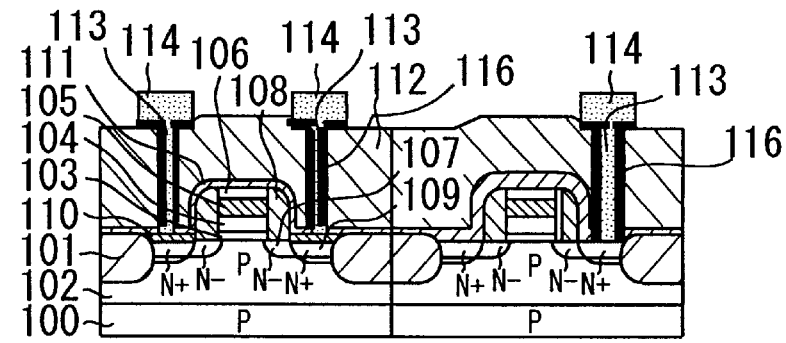
Figure 3:
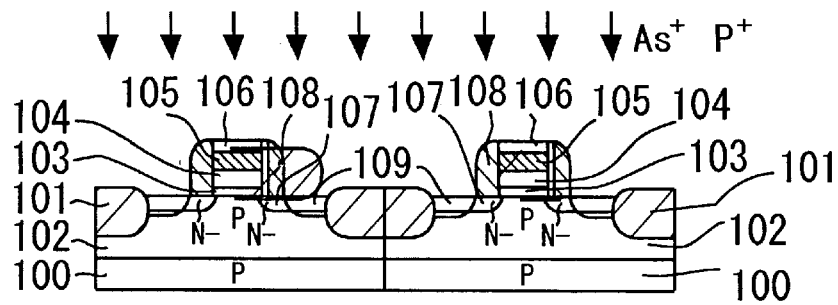
FIGS. 3(A)–3(E) shows the manufacturing flow of a conventional salicide transistor exemplified by the formation on an NMOS.
Figure 3:
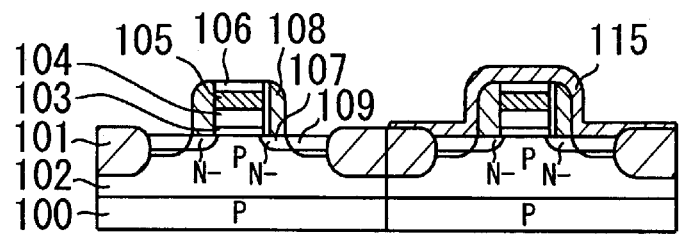
Figure 3:
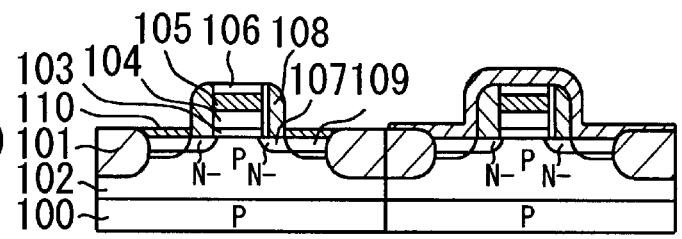
Figure 3:
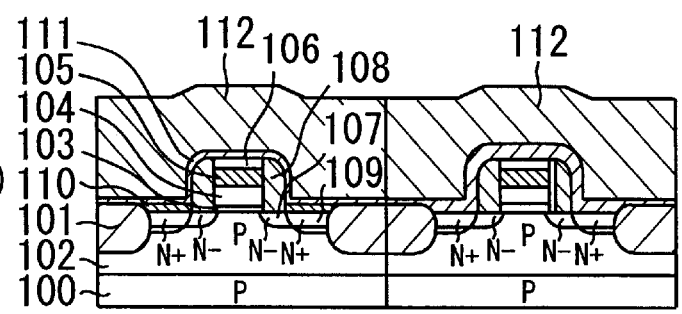
Figure 3:
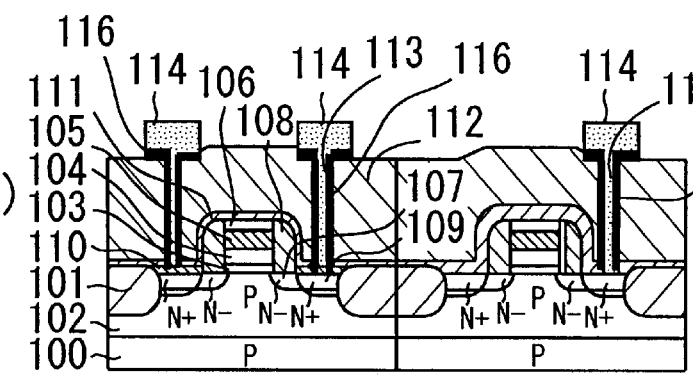

Embodiments of the present invention will be described below with reference to the accompanying drawings. It is noted that the same reference symbols in the drawings denote the same or corresponding components.

First Embodiment

FIGS. 1(A)–1(E) show a process flow of manufacturing a salicide transistor according to first embodiment of the present invention. In FIG. 1, reference numeral 100 denotes a P-type Si substrate, 102 denotes a P well, 101 denotes an element separating oxide film formed on the P well 102, 103 denotes a gate oxide film, 104 denotes an N-type poly-Si gate electrode formed on the gate oxide film 103, 105 denotes a WSi gate electrode formed on the N-type poly-Si gate electrode 104, 106 denotes an oxide film formed on the WSi gate electrode 105, 108 denotes a side wall that covers the side of the WSi gate electrode 105 and the like, 107 denotes an N-type LDD (lightly doped drain) region, and 109 denotes a high-concentration implanted layer (high-concentration diffusion layer) region.

As FIG. 1(A) shows, the formation of element separating oxide films 101, the implantation of P wells 102, the formation of gate electrodes 105 and the like, the formation of N$^-$-type LDD region 107, and the formation of side walls 108 are performed by known methods, and an impurity is implanted into the region 109 where the high-concentration diffusion layer of source/drain regions and the like is formed. An opening is made in only the implantation region by the patterning of a photoresist (not shown), 4×10 cm$^{-2}$ of As$^+$ ions are implanted under the condition of an energy of 30 KeV, and 1×10 cm$^{-2}$ of P$^+$ ions are implanted under the condition of an energy of 40 KeV.

In FIG. 1(B), reference numeral 109 denotes a high-concentration source/drain region formed by the above-described impurity implantation. As FIG. 1(B) shows, after the removal of the resist and cleaning using chemical solutions such as a sulfuric acid and hydrogen peroxide mixed solution, heat treatment for recovering the crystallinity of the implanted layer 109 and activating the impurity is performed. For example, annealing is performed in an N$_2$ atmosphere of an atmospheric pressure at a temperature of 825° C. (first temperature) for 20 minutes.

As FIG. 1(C) shows, CoSi$_2$ 110 is formed only in the region where Si is exposed using a salicide flow. First, the oxide film is removed using a diluted HF aqueous solution from the Si surface of the region 109 where the high-concentration diffusion layer is to be formed, and thereafter, the film is formed by spattering Co to a thickness of 7 nm. Next, lump annealing is performed in an N$_2$ atmosphere at 430° C. for 90 seconds to allow Co to react with Si to form a Co—Si compound, and then free Co is removed using a nitric acid/acetic acid/phosphoric acid mixed aqueous solution.

Thereafter, lump annealing is performed at or above the film forming temperature of the interlayer film to be formed after forming salicide (predetermined temperature). For example, lump annealing is performed in an $N_2$ atmosphere of an atmospheric pressure at a temperature of 750° C. (second temperature) for 60 seconds (first period of time). The purpose of lump annealing is to stabilize the composition of $CoSi_2$ 110 not to change during forming the interlayer film. In the first embodiment, since the temperature to form the interlayer insulating film on the $CoSi_2$ 110 (predetermined temperature) is 700° C., the lump annealing temperature is determined to be 750° C. (second temperature). In addition, the reason why this temperature is lower than the above-described temperature (825° C.) of the heat treatment for recovering the crystallinity of the implanted layer 109 and activating the impurity (first temperature) is to prevent both the deterioration of the surface morphology of the $CoSi_2$ 110 and the deterioration of the transistor properties. With regard to the surface morphology of the $CoSi_2$ 110, since the film thickness of the $CoSi_2$ 110 becomes difficult to control in uniformity if the temperature is elevated, the temperature cannot be elevated extremely. From the point of view of inhibiting the deterioration of the transistor properties, for example, increase in parasitic resistance or the short-channel effect, extremely high temperatures must be avoided. The reasons are not to break the profile of source/drain impurity distribution, and to inhibit the absorption of the impurity into the $CoSi_2$ 110 layer. The temperature is preferably 750° C. (second temperature), and the period of time is preferably 60 seconds.

Next, as FIG. 1(D) shows, an interlayer insulating film is formed. A thin $Si_3N_4$ film 111 of a thickness of 10 nm is formed using the reduced pressure CVD method at a film forming temperature of 700° C., on which a BPSG film 112 of a thickness of 60 nm is formed using the normal pressure CVD method at a film forming temperature of 350° C. Thereafter, heat treatment is performed for the reflow of the BPSG film 112 in the purpose of improving the embedding property of the interlayer film between gate electrodes 105 or the like, and improving surface flatness. The reflow is performed in an $H_2/O_2$ atmosphere of an atmospheric pressure at 800° C. for 20 minutes. Although this temperature is preferably as low as possible not to break the profile of source/drain impurity distribution, the lower limit of the temperature at which reflow is possible, about 800° C. (third temperature) is preferable.

Thereafter, as FIG. 1(E) shows, a barrier metal (TiN) 116 and a contact plug (W plug) 113 structures are formed after opening the contact holes, and wiring (aluminum wiring) 114 is formed. When a device having a DRAM and a logic device is formed, the memory-cell capacitor structure is also formed.

According to the first embodiment, as described above, the salicide process and heat treatment, which raise problems when salicide transistors are used in the device having both a DRAM and a logic device, can be optimized. Even if heat treatment of about 800° C. required for the flow of forming a DRAM capacitor cell structure is performed after forming the salicide, both the rise of narrow-line resistance and increase in junction leakage due to the composition of the silicide and change in morphology can be inhibited, and the deterioration of the transistor properties or current driving capability can be prevented.

Second Embodiment

FIGS. 2(A)–2(F) show the process flow of manufacturing a salicide transistor according to the second embodiment of the present invention. In FIG. 2, since the parts represented by the same symbols as in FIG. 1 are the same parts as in FIG. 1, the description of these parts are omitted.

As FIG. 2(A) shows, the formation of element separating oxide films 101, the implantation of P wells 102, the formation of gate electrodes 105 and the like, the formation of $N^-$-type LDD region 107, and the formation of side walls 108 are performed by known methods, and an impurity is implanted into the region 109 where the high-concentration diffusion layer of source/drain regions and the like is formed. An opening is made in only the implantation region by the patterning of a photoresist (not shown), $4\times10$ $cm^{-2}$ of $As^+$ ions are implanted under the condition of an energy of 30 KeV, and $1\times10$ $cm^{-2}$ of $P^+$ ions are implanted under the condition of an energy of 40 KeV.

As FIG. 2(B) shows, after the removal of the resist and cleaning using chemical solutions such as sulfuric acid and hydrogen peroxide mixed solution, heat treatment for recovering the crystallinity of the implanted layer 109 and activating the impurity is performed. For example, annealing is performed in an $N_2$ atmosphere of an atmospheric pressure at a temperature of 825° C. (first temperature) for 20 minutes.

Prior to the salicide forming process, a protecting film is formed and patterned to protect regions from the silicifying reaction where silicide is not to be formed. As FIG. 2(C) shows, a TEOS oxide film 115 of a thickness of 50 nm is formed as the protecting film from the silicifying reaction using the reduced pressure CVD method at a film formation temperature of 670° C. Thereafter, the resist is patterned using a photolithography process to open a desired portion for forming silicide. Next, the oxide film is removed from the opened portion of the resist using a diluted HF aqueous solution. Thereafter, no heat treatment is performed at or above the temperature when the TEOS oxide film 115 is formed until the Co film is formed.

As FIG. 2(D) shows, $CoSi_2$ 110 is formed only in the region where Si is exposed using a salicide flow. First, the oxide film is removed using a diluted HF aqueous solution from the Si surface of the region 109 where the high-concentration diffusion layer is to be formed, and thereafter, the film is formed by spattering Co to a thickness of 7 nm. Next, lump annealing is performed in an $N_2$ atmosphere at 430° C. for 90 seconds to allow Co to react with Si to form a Co—Si compound, and then free Co is removed using a nitric acid/acetic acid/phosphoric acid mixed aqueous solution.

Thereafter, lump annealing is performed at or above the film forming temperature of the interlayer film to be formed after forming salicide (predetermined temperature). For example, lump annealing is performed in an $N_2$ atmosphere of an atmospheric pressure at a temperature of 750° C. (second temperature) for 60 seconds (first period of time). The purpose of lump annealing is to stabilize the composition of $CoSi_2$ 110 not to change during forming the interlayer film. In second embodiment, since the temperature to form the interlayer insulating film on the $CoSi_2$ 110 (predetermined temperature) is 700° C., the lump annealing temperature is determined to be 750° C. In addition, the reason why this temperature is lower than the above-described temperature (825° C.) of the heat treatment for recovering the crystallinity of the implanted layer 109 and activating the impurity (first temperature) is to prevent both the deterioration of the surface morphology of the $CoSi_2$ 110 and the deterioration of the transistor properties. With regard to the surface morphology of the $CoSi_2$ 110, since the film thickness of the $CoSi_2$ 110 becomes difficult to control in uniformity if the temperature is elevated, the temperature cannot be elevated extremely. From the point of view of inhibiting the deterioration of the transistor properties, for example, increase in parasitic resistance or the short-channel effect, extremely high temperatures must be avoided. The reasons are not to break the profile of source/drain impurity distribution, and to inhibit the absorption of the impurity into the $CoSi_2$ 110 layer. The temperature is preferably 750° C. (second temperature), and the period of time is preferably 60 seconds.

Next, as FIG. 2(E) shows, an interlayer insulating film is formed. A thin $Si_3N_4$ film 111 of a thickness of 10 nm is formed using the reduced pressure CVD method at a film forming temperature of 700° C., on which a BPSG film 112 is formed using the normal pressure CVD method at a film forming temperature of 350° C. Thereafter, heat treatment is performed for the reflow of the BPSG film 112 in the purpose of improving the embedding property of the interlayer film between gate electrodes 105 or the like, and improving surface flatness. The reflow is performed in an $H_2/O_2$ atmosphere of an atmospheric pressure at 800° C. for 20 minutes. Although this temperature is preferably as low as possible not to break the profile of source/drain impurity distribution, the lower limit of the temperature at which reflow is possible, about 800° C. (third temperature) is preferable.

Thereafter, as FIG. 2(F) shows, a barrier metal (TiN) 116 and a contact plug (W plug) 113 structures are formed after opening the contact holes, and wiring (aluminum wiring) 114 is formed. When a device having a DRAM and a logic device is formed, the memory-cell capacitor structure is also formed.

According to the second embodiment, as described above, the salicide process and heat treatment, which raise problems when salicide transistors are used in the device having both a DRAM and a logic device, can be optimized. Since the crystallinity of the implanted layer 109 has been recovered before the silicide protecting film is formed, salicide can be formed under the conditions where the crystallinity of the diffusion layer is good. If the oxide film, which is a silicide protecting film, is formed under the conditions where the crystallinity of the implanted layer has not been sufficient, the adverse effect due to the mixing of oxygen may cause a problem. For example, junction leakage due to crystal-lattice defect, and increase in resistance due to the mixing of oxygen may cause a problem. In the second embodiment, since crystallinity is recovered by performing annealing once before forming the protecting film after high-concentration implantation, the above-described problems can be solved. Furthermore, since the salicide process and the following heat treatment are optimized, even if heat treatment of about 800° C. required for forming a DRAM capacitor cell structure is performed after forming the salicide, both the rise of narrow-line resistance and increase in junction leakage due to the composition of the silicide and change in morphology can be inhibited, and the deterioration of the transistor properties or current driving capability can be prevented.

As described above, according to the present invention, there is provided a method for manufacturing a salicide transistor, a semiconductor storage, and a semiconductor device, in which salicide is formed by adding an impurity to the high-concentration source/drain region on a semiconductor substrate, performing heat treatment at a first temperature, and then performing heat treatment at a second temperature higher than a predetermined temperature and lower than the first temperature for a first period of time; an interlayer insulating film is formed; and heat treatment is performed at a third temperature higher than the second temperature and lower than the first temperature; thereby simultaneously solving the problem of increase in so-called narrow-line resistance and the problem of the occurrence of P-N-junction leakage. Moreover, there is provided a method for manufacturing a salicide transistor, a semiconductor storage, and a semiconductor device that can give an optimized process as the total LSI device manufacturing process flow.

Furthermore, since the crystallinity of the implanted layer 109 has been recovered before forming the silicide protecting film, salicide can be formed under the condition where the crystallinity of the diffusion layer is good. Since heat treatment is also optimized during and after the salicide process, both an increase in narrow-line resistance and an increase in junction leakage due to change in composition or mo,rphology of the silicide can be inhibited even if heat treatment at about 800° C. required for the DRAM capacitor cell structure forming flow is performed after the salicide has been formed, and the deterioration of transistor properties or current driving capability can be prevented.

In the method for manufacturing a salicide transistor, the step of a heat-treatment may be performed at the second temperature for a second period of time longer than the first period of time after forming an interlayer insulating film on the semiconductor substrate that contains the salicide.

Here, the method for manufacturing a salicide transistor may further comprise a step of forming a protecting film for inhibiting the silicifying reaction on a predetermined region on the semiconductor substrate, prior to the salicide forming step.

In the method for manufacturing a salicide, the predetermined temperature may be 700° C., and the first temperature may be 825° C.

In the method for manufacturing a salicide transistor, the first period of time may be 60 seconds, and the period of time may be 20 minutes.

The present invention has been described in detail with respect to various embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

The entire disclosure of Japanese Patent Application No. 2000-220606 filed on Jul. 21, 2000 including specification, claims, drawings and summary are incorporated herein by reference in its entirety.

What is claimed is:

1. A method for manufacturing a salicide transistor, comprising the steps of
    performing heat treatment at a first temperature after implanting an impurity into a high-concentration source/drain region on a semiconductor substrate;
    forming salicide by heat-treating a predetermined region on said semiconductor substrate at a second temperature higher than a predetermined temperature and lower than said first temperature for a first period of time; and
    performing heat treatment at a third temperature higher than said second temperature and lower than said first temperature after forming an interlayer insulating film on the semiconductor substrate that contains said salicide.

2. The method for manufacturing a salicide transistor according to claim 1, wherein said step of a heat treatment is performed at said second temperature for a second period of time longer than said first period of time after forming an interlayer insulating film on the semiconductor substrate that contains said salicide.

3. The method for manufacturing a salicide transistor according to claim 2, further comprising a step of forming a protecting film for inhibiting the silicifying reaction on a predetermined region on said semiconductor substrate, prior to said salicide forming step.

4. The method for manufacturing a salicide transistor according to claim 2, wherein said predetermined temperature is 700° C., and the first temperature is 825° C.

5. The method for manufacturing a salicide transistor according to claim 2, wherein said first period of time is 60 seconds, and said second period of time is 20 minutes.

6. The method for manufacturing a salicide transistor according to claim 1, further comprising a step of forming a protecting film for inhibiting the silicifying reaction on a predetermined region on said semiconductor substrate, prior to said salicide forming step.

7. The method for manufacturing a salicide transistor according to claim 6, wherein said predetermined temperature is 700° C., and the first temperature is 825° C.

8. The method for manufacturing a salicide transistor according to claim 6, wherein said first period of time is 60 seconds, and said second period of time is 20 minutes.

9. The method for manufacturing a salicide transistor according to claim 1, wherein said predetermined temperature is 700° C., and the first temperature is 825° C.

10. The method for manufacturing a salicide transistor according to claim 1, wherein said first period of time is 60 seconds, and said second period of time is 20 minutes.

11. A semiconductor storage, comprising salicide transistors manufactured using the method for manufacturing a salicide transistor according to claim 1.

12. A semiconductor device, comprising a semiconductor storage and a logic device comprising salicide transistors manufactured using the method for manufacturing a salicide transistor according to claim 1.

* * * * *

UNITED STATES PATENT AND TRADEMARK OFFICE
CERTIFICATE OF CORRECTION

PATENT NO. : 6,313,032 B1
DATED : November 6, 2001
INVENTOR(S) : Keiichi Yamada et al.

It is certified that error appears in the above-identified patent and that said Letters Patent is hereby corrected as shown below:

<u>Title page,</u>
Item [54], change "METHOD FOR MANUFACTURING A SALICIDE TRANSISTOR, SEMICONDUCTOR STORAGE, AND SEMICONDUCTOR DEVICE" to
-- METHOD FOR MANUFACTURING A SALICIDE TRANSISTOR (As Amended) --

Signed and Sealed this

Nineteenth Day of March, 2002

Attest:

*Attesting Officer*

JAMES E. ROGAN
*Director of the United States Patent and Trademark Office*